United States Patent
Cohen et al.

(10) Patent No.: US 6,559,046 B1
(45) Date of Patent: May 6, 2003

(54) INSULATOR FOR INTEGRATED CIRCUITS AND PROCESS

(75) Inventors: Stephan Alan Cohen, Wappingers Falls, NY (US); Vincent James McGahay, Poughkeepsie, NY (US); Ronald Robert Uttecht, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/883,427

(22) Filed: Jun. 26, 1997

Related U.S. Application Data (60) Continuation of application No. 08/610,059, filed on Feb. 29, 1996, now abandoned, which is a division of application No. 08/345,099, filed on Nov. 28, 1994, now Pat. No. 5,530,293.

(51) Int. Cl.[7] .................................... H01L 21/4763
(52) U.S. Cl. ........................................ 438/624
(58) Field of Search ................ 438/624, 763, 438/782, 795, 637, 622, 640, 781, 631, 699, 906, 908

(56) References Cited

U.S. PATENT DOCUMENTS

| | | | |
|---|---|---|---|
| 4,239,346 A | 12/1980 | Lloyd | 350/332 |
| 4,349,609 A * | 9/1982 | Takeda et al. | 438/623 |
| 4,576,834 A * | 3/1986 | Sobczak | 438/781 |
| 4,756,977 A | 7/1988 | Haluska et al. | 428/704 |
| 4,849,296 A | 7/1989 | Haluska et al. | 428/457 |
| 5,059,448 A | 10/1991 | Chandra et al. | 427/53.1 |
| 5,085,893 A | 2/1992 | Weiss et al. | 427/387 |
| 5,118,530 A | 6/1992 | Hanneman et al. | 427/226 |
| 5,194,928 A | 3/1993 | Cronin et al. | 257/629 |
| 5,258,334 A | 11/1993 | Lantz, II | 437/238 |
| 5,319,247 A | 6/1994 | Matsuura | 257/760 |
| 5,320,868 A * | 6/1994 | Ballance et al. | 427/228 |
| 5,370,903 A | 12/1994 | Minz et al. | 437/238 |
| 5,370,904 A | 12/1994 | Minz et al. | 437/238 |
| 5,380,555 A | 1/1995 | Minz et al. | 437/238 |
| 5,387,480 A | 2/1995 | Haluska et al. | 437/238 |
| 5,441,765 A * | 8/1995 | Ballance et al. | 438/781 |
| 5,457,073 A | 10/1995 | Ouellet | 437/231 |
| 5,496,776 A | 3/1996 | Chien et al. | 437/238 |
| 5,516,721 A | 5/1996 | Galli et al. | 437/238 |
| 5,523,163 A | 6/1996 | Ballance et al. | 428/446 |

FOREIGN PATENT DOCUMENTS

JP 6-196574 7/1994

OTHER PUBLICATIONS

Wolf, Stanley, Silicon Processing for the VLSI Era, vol. 2, Lattice Press, 1990, pp. 188–191.*
Wolf et al., Silicon Processing for the VLSI Era, vol. 1, Process Technology, Lattice Press, Sunset Beach, CA, pp. 220–223.
Pramanik et al., "Reliability of Multilevel Circuits Using Hydrogen Silsesquioxane $FO_x$ for Interlevel Dielectric Planarization," Jun. 8–9, 1993 VMIC Conference, 1993 ISMIC–102/93/0329, pp. 329–331.
Ballance et al., "Low Temperature Reflow Planarization Using a Novel Spin–on Interlevel Dielectric," Dow Corning Corporation, Fremont, CA, VMIC Conference, Jun. 9, 1992.

* cited by examiner

Primary Examiner—Carl Whitehead, Jr.
Assistant Examiner—Laura M. Schillinger
(74) Attorney, Agent, or Firm—Conolly Bove Lodge & Hutz, LLP; Robert M. Trepp (57) ABSTRACT

An insulator for covering an interconnection wiring level in a surface thereof on a semiconductor substrate containing semiconductor devices formed by curing a flowable oxide layer and annealing. The annealing is carried out in the presence of hydrogen and aluminum to obtain a dielectric constant of the oxide layer to a value below 3.2.

Also provided is electrical insulation between neighboring devices using the flowable oxide which is cured and annealed. In this case, the annealing can be carried out in hydrogen with or without the presence of aluminum.

18 Claims, 7 Drawing Sheets

INSULATOR FOR INTEGRATED CIRCUITS AND PROCESS

The application is a continuation of U.S. patent application Ser. No. 08/610,059, filed Feb. 29, 1996, now abandoned, which is a Divisional of Ser. No. 08/345,099 filed Nov. 28, 1994 now U.S. Pat. No. 5,530,293.

TECHNICAL FIELD

The present invention is concerned with the use of certain flowable oxide layers as back end insulators for semiconductor devices. The present invention provides an insulator that exhibits a unique combination of relatively low dielectric constant below 3.2 and excellent gap fill capability. The back end insulator of the present invention can be formed by curing a flowable oxide layer and by annealing in the presence of hydrogen and aluminum.

The present invention is also concerned with the use of certain flowable oxides as an insulator between devices, that is, to electrically isolate the devices from each other. The isolator for this purpose can be formed by curing a flowable oxide and by annealing in the presence of hydrogen with or without aluminum.

BACKGROUND ART

The use of thin film ceramic silica coatings as protective and dielectric layers for electronic devices is known in the art. Currently, $SiO_2$ is used as the back-end dielectric in semiconductor devices. However, as chip function integration increases, back end wiring densities also increase. Because of this, there exists a greater need for intra-level insulators having lower dielectric constants than the presently used $SiO_2$. This is crucial in order to reduce delays due to cross-talk and stray capacitance. Presently used $SiO_2$ has a dielectric constant of 4, which may limit its use because of the potential cross-talk and RC delays.

Moreover, because of reduced spacings between lines, the need for the insulation to conformally fill small spaces is increasingly important.

Since device density is also increasing with increasing complexity, the need to electrically insulate devices from each other has become important as well. With smaller inter-device dimensions, providing trenches conformally filled with dielectrics between devices, will become increasingly difficult.

SUMMARY OF INVENTION

The present invention provides an insulator that exhibits a unique combination of low dielectric constant below 3.2 and excellent gap fill capability. For example, insulators, according to the present invention, exhibit excellent gap-fill for an aspect ratio of 3 with depths of 400 nm or less.

In particular, the present invention is concerned with an insulator for covering an interconnection wiring level in a surface thereof on a semiconductor substrate containing semiconductor devices comprising:

a first flowable oxide layer coated on the interconnection wiring level, wherein said layer is cured. The layer is also annealed in the presence of hydrogen and aluminum. The hydrogen diffuses into the flowable oxide layer and reduces its dielectric constant to a value below 3.2.

The present invention is also concerned with an insulation for covering an interconnection wiring level in a surface thereof on a semiconductor substrate containing semiconductor devices comprising a cured hydrogen silsesquioxane polymer having a dielectric constant of below 3.2 and being passivated by externally introduced hydrogen.

The present invention is also concerned with a process for covering an interconnection wiring level in a surface thereof on semiconductor substrate which comprises:

coating a first flowable oxide layer onto the interconnection wiring level;

curing the flowable oxide layer, and annealing said layer wherein said annealing is carried out in the presence of hydrogen and aluminum to cause gas to diffuse into the flowable oxide layer and reduce its dielectric constant to a value below 3.2.

The present invention is also concerned with using the flowable oxide as a dielectric to electrically insulate neighboring devices. The structure comprises:

two neighboring or adjacent FET or bipolar transistor devices;

a trench in the substrate located between these devices; and wherein the trench is filled with the flowable oxide that has been cured and annealed.

According to this aspect of the present invention, the flowable oxide is annealed in the presence of hydrogen and either in the presence or absence of aluminum.

The present invention is also concerned with a process for insulating adjacent devices in a semiconductor substrate. The process comprises providing a semiconductor device comprising a semiconductor substrate; at least two FET or bipolar transistor devices and a trench in the substrate located between the devices. The process further includes flowing a flowable oxide into the trench followed by curing and annealing. The annealing is carried out in the presence of hydrogen.

BEST AND VARIOUS MODES FOR CARRYING OUT THE PRESENT INVENTION

The flowable oxide layers used in the present invention can be obtained from hydrogen silsesquioxanes, which are carbon free $SiO_2$ precursors and have been referred to as flowable oxides or FOx. Examples of such are disclosed in U.S. Pat. No. 5,085,893, disclosure of which is incorporated herein by reference. These can be represented by the formula:

where n is an integer greater than about 8, x is a number between 0 and 2, and preferably less than 1. The silanol content of these compositions is typically about 1–10% by weight and preferably about 4–8% by weight. The silsesquioxane is preferably employed as a 1–20% by weight solution in a non-sulfur containing organic polar solvent. The preferred solvents are ethyl acetate, methyl isobutyl ketone, t-butyl acetate, diethyl ether or mixtures thereof. The preferred hydrogen silsesquioxane is $FO_x15$, an 18% solution of the silsesquioxane in 82% methyl isobutyl ketone.

$FO_x16$, which is a 22% solution, does not provide a reduced dielectric constant by the annealing. The $FO_x$ materials are commercially available from Dow Corning Corporation.

The flowable oxide can be applied to the semiconductor substrate by any of a number of known procedures. For example, the solution containing the hydrogen silsesquioxane can be coated onto the semiconductor by spray coating, dip coating, flow coating or spin coating. The composition is preferably caused to flow over the substrate at elevated temperatures, such as about 250° C. to 350° C. in nitrogen, to fill the gaps between the electrically conductive lines. This results in conformally filling the gaps between the metal lines with the flowable oxide to the top of the lines, as well as filling high aspect ratio trenches between devices in the substrate. Aspect ratios of at least 3 are typical.

The substrate contains semiconductor devices as known and is preferably a silicon, silicon germanium or gallium arsenide semiconductor substrate.

The coating is then cured. The curing is typically carried out in a nitrogen ambient at a temperature of about 360° C. to about 500° C. and preferably about 360° C. to about 440° C. The curing usually takes about 1 to about 2 hours.

Critical to the success of this aspect of the present invention is the annealing of the hydrogen silsesquioxane in the presence of hydrogen and aluminum. The annealing can be carried out along with the curing or subsequent thereto. The annealing is carried out at a temperature of about 350° C. to about 500° C. and preferably about 360° C. to about 440° C. The aluminum is preferably present in the wiring level, but can be introduced otherwise. It can be present along with other metals, such as copper in the wiring, if desired. The amount need only be in a catalytic amount for the annealing process, such as about 1% of the typical wiring.

The hydrogen in the anneal can be present as hydrogen gas ($H_2$), molecular or ionic hydrogen, or hydrogen in an excited state. Preferably, the hydrogen is present as hydrogen gas and more preferably as a mixture with an inert gas, such as helium or nitrogen. When present in a mixture, the mixture usually contains about 5 to 95% by volume and preferably about 5 to about 15% by volume of hydrogen and, correspondingly about 95 to about 5% by volume and preferably about 95 to about 85% by volume of inert gas. Most preferably, the annealing gas is forming gas containing about 10% $H_2$ and about 90% $N_2$ by volume.

The annealing usually takes about 15 to about 30 minutes, typical example being about 20 minutes.

Without being limited to any particular theory, it is believed that the aluminum and hydrogen interact so that molecular hydrogen breaks down into atomic hydrogen, which then binds or settles into small pores in the film. It is also believed that the hydrogen in turn blocks or prevents $H_2O$ from entering and remaining in the film, such as nanopores in the film. If hydrogen is already in the atomic or excited state, then the presence of aluminum may not be necessary.

It is also theorized that the hydrogen, in turn, reacts with the oxide film. In any event, regardless of the mechanism involved, the annealing unexpectedly reduces the dielectric constant of the oxide layer to a value of 3.2 and below and passivates the film.

The insulation layer is preferably about 500 angstroms to about 1 micron in thickness.

If desired, the insulator can be capped with another dielectric layer, such as silicon oxide or silicon nitride, or a polymeric layer (e.g., polyimide) or another flowable oxide or a diamond-like carbon layer.

Alternatively, another dielectric ($SiO_2$ or polyimide, for example) can be put onto this structure as an inter-level dielectric, followed by more metal patterning and a repeat of the flowable oxide spin-on and gap-fill. In this way, metal levels can be built using the flowable oxide with a lower dielectric constant insulation between lines than what is now achieved as well as good gap fill. The capping layer is applied after the final metal level is built.

Particular examples being PECVD (plasma enhanced chemical vapor deposition) or LPCVD (low plasma chemical vapor phase deposition) $SiO_2$. When the flowable oxide is capped with the dielectric, such as $SiO_2$, good film thickness, uniformity and planarity are achieved. This results in a reduced need for chemical-mechanical polishing or other planarizing techniques. Accordingly, the present invention provides advantages in fill, dielectric constant and reduced processing time.

Reference to the figures illustrate various configurations that can employ the flowable oxide insulator layer of the present invention.

Figure 1A:
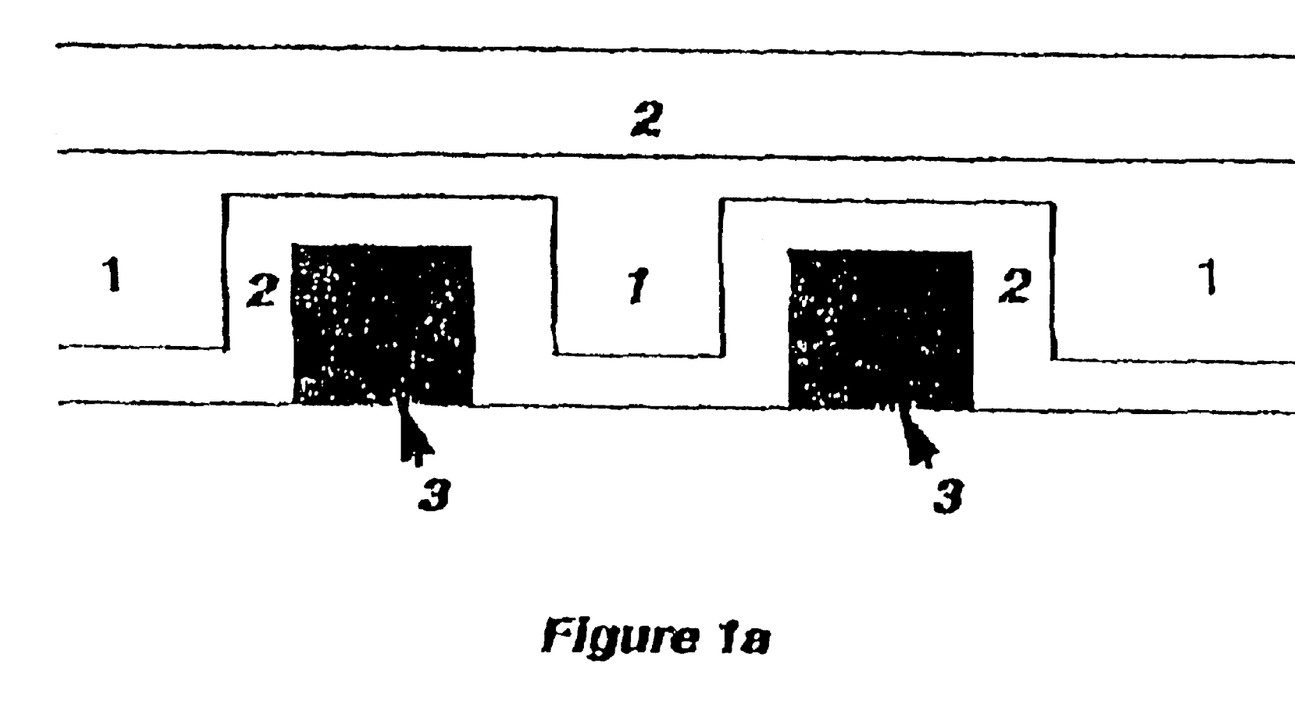
FIGS. 1a, 1b, 1c, 2, 3 and 4 are schematic diagrams of various structures employing the insulating layer of the present invention.
Figure 1B:
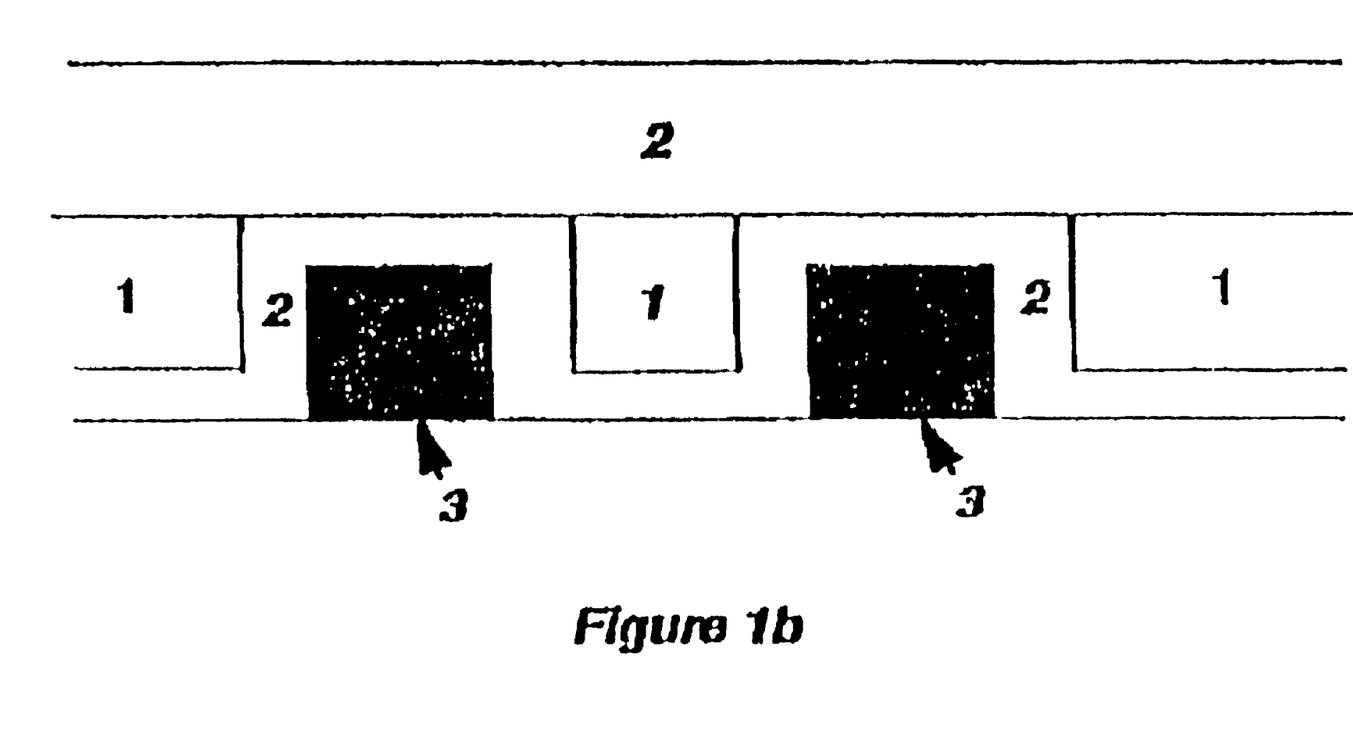
Figure 1C:
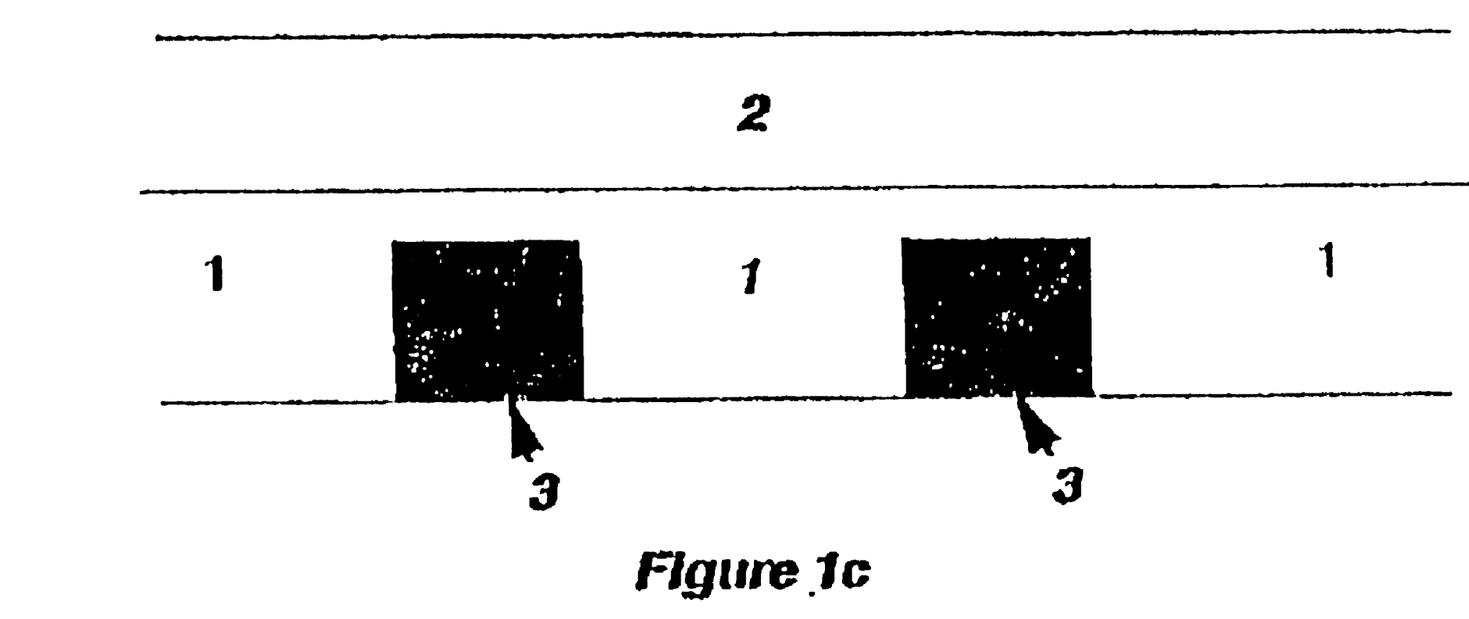

In FIG. 1a, metal wires (3) of a given back end wiring level are shown covered by a thin (50–100 nm) film composed of the interlevel dielectric (2) followed by a spin coating of the flowable oxide (1). This provides a liner, if desired, between the metal wires and the flowable oxide film. Alternatively, the configuration of FIG. 1b can be used where, after the flowable oxide is deposited, an etching or polishing step is introduced so that only the interval dielectric film is over the metal wires (3) and the remaining flowable oxide is between the wires (3) and the liner dielectric (2). FIG. 1c shows the flowable oxide (1) completely covering the wiring (3) with the interlevel dielectric (2) deposited directly on it.

Figure 2:
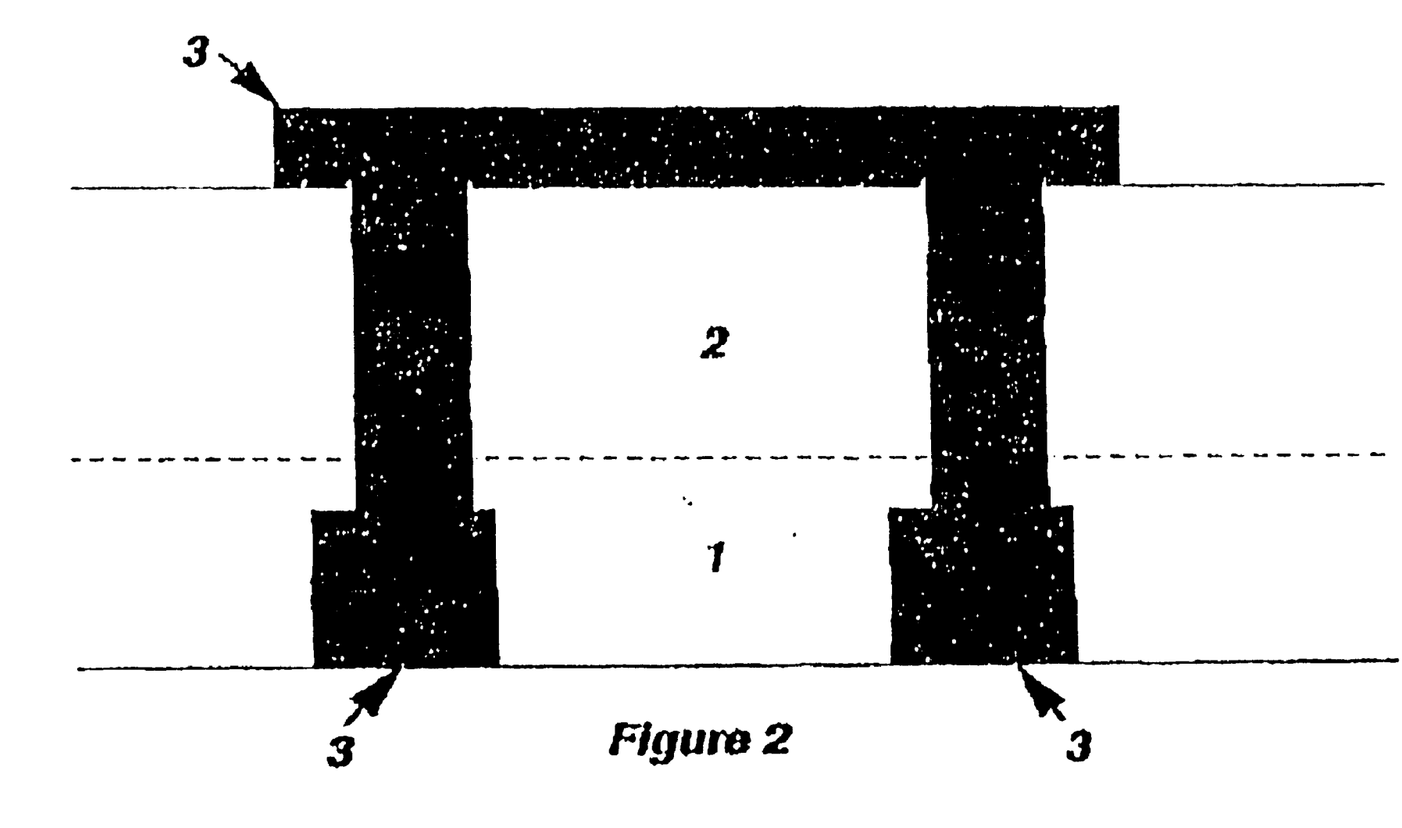

FIG. 2 shows an example of non-tapered metal (3) studs in an interlevel dielectric layer (2) deposited directly on flowable oxide (1). The flowable oxide completely covers the metal wiring and part of the metal stud. This structure can be modified to contain the variations shown in FIGS. 1a and 1b, where thin $SiO_2$ layers can be deposited as a liner over the wiring and under the next flowable oxide (1) layer.

Figure 3:
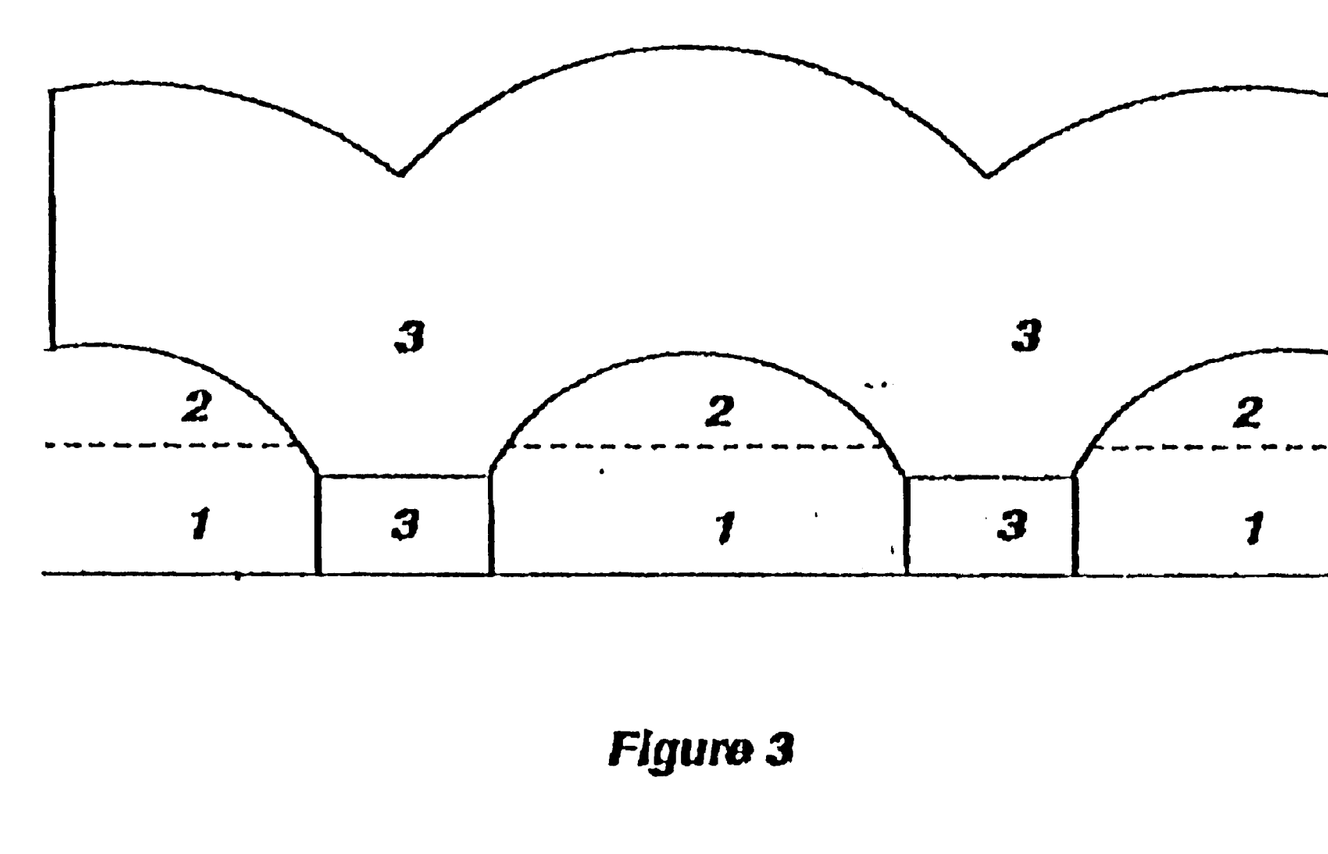

FIG. 3 shows an example of tapered metal interconnects (3) in a dielectric film composed of the interlevel dielectric (2) deposited directly on the flowable oxide layer (1). This shows tapered metal vias connecting directly to metal lines within a given wiring level. These lines are shown covered with the flowable oxide (1). The vias are formed by etching tapered holes in the interlevel dielectric (2) and filing them with metal (3). In this case too, the variations shown in FIGS. 1a and 1b can be used.

Figure 4:
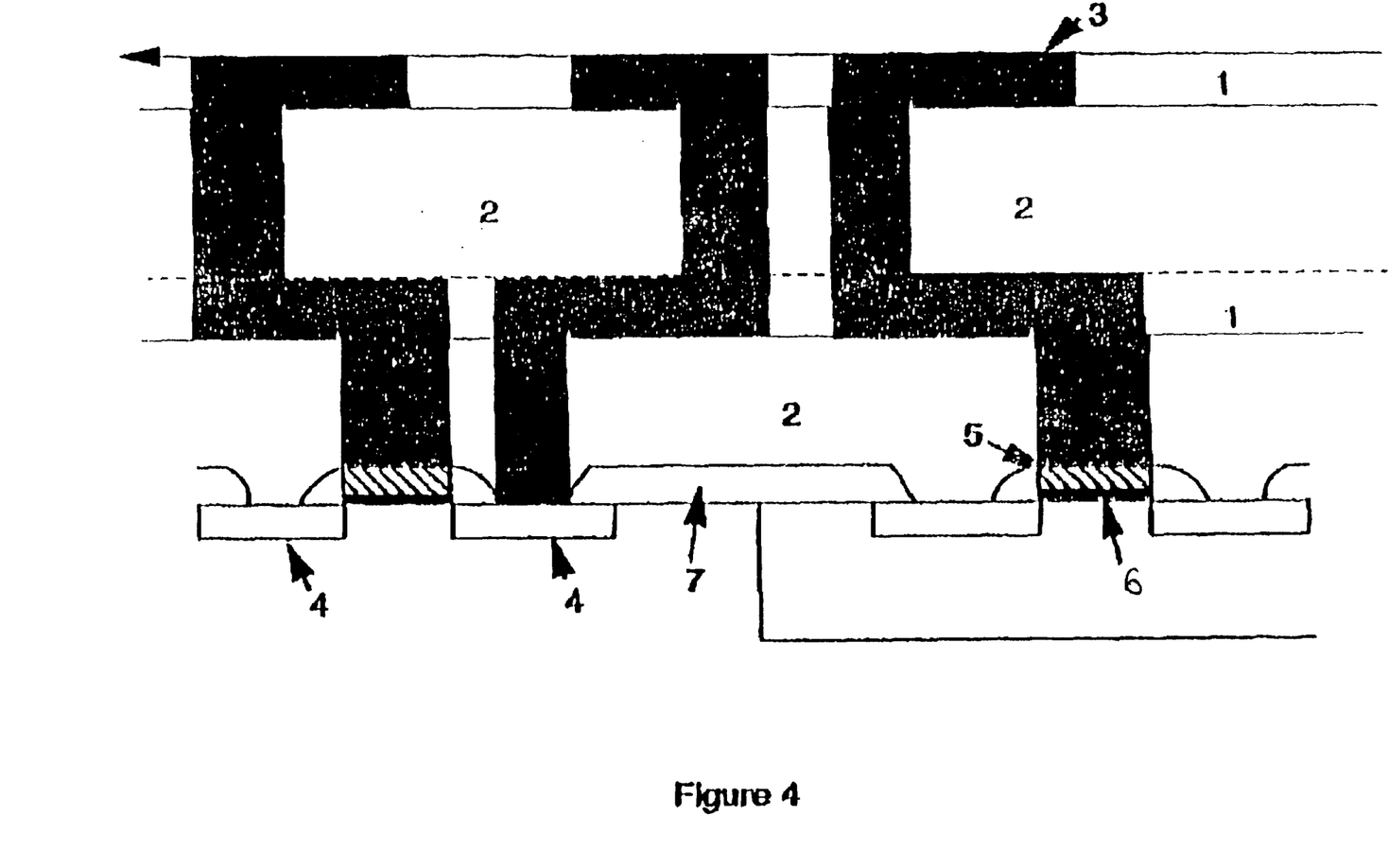

FIG. 4 shows an example of an integrated CMOS circuit incorporating the flowable oxide in a back end wiring scheme. This is an example of how 3 active device areas are connected to metal (3) studs and wires with the flowable oxide (1) surrounding the wires and the interlevel dielectric (2) between the wires surrounding the studs. In FIG. 4, numeral 4 represents source and drain regions, numeral 5 a gate, numeral 6, the gate dielectric and numeral 7, field oxide.

Figure 5:
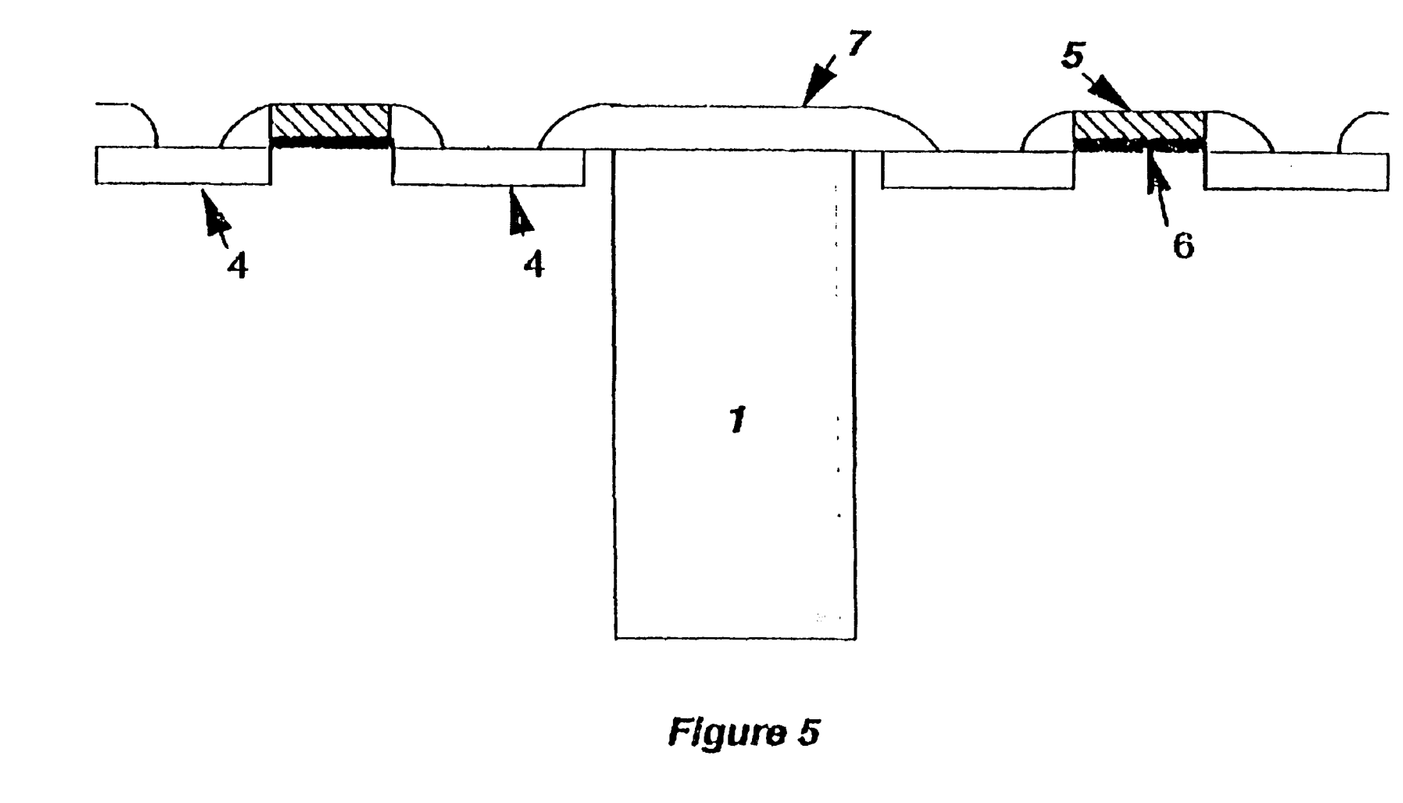
FIG. 5 is a schematic diagram of two neighboring field effect transistors (FET) with a trench filled with the flowable oxide located between them.

FIG. 5 is directed to a further aspect of the present invention, and shows an example of two neighboring field effect transistors which are separated by a trench, into the substrate, filled with the flowable oxide (1). A field oxide (7) is over the trench to reinforce this isolation. In this FIG. 5, numeral 4 represent the source and drain of one FET, and numeral 5 represents the gate of the second FET with dielectric 6 between the gate and substrate.

The flowable oxide provides for electrical stability of the device in that its dielectric constant, as well as any leakage currents, remain stable over time.

The flowable oxide is provided in a manner similar to that described above for the back-end isolation, except that aluminum is not required during the annealing. However, such can be presented, if desired.

For example, flowable oxide can be applied in the trench by any of a number of known procedures. The composition is preferably caused to flow in the trench at elevated temperatures, such as about 250° C. to 350° C. in nitrogen, to fill the trench.

The fill is then cured. The curing is typically carried out in a nitrogen ambient at a temperature of about 360° C. to about 500° C. and preferably about 360° C. to about 440° C. The curing usually takes about 1 to about 2 hours.

The fill is also annealed. Annealing of the hydrogen silsesquioxane is carried out in the presence of hydrogen and optionally, in the presence of aluminum. The annealing can be carried out along with the curing or subsequent thereto. The annealing is carried out at a temperature of about 350° C. to about 500° C. and preferably about 360° C. to about 440° C.

The hydrogen in the anneal can be present as hydrogen gas ($H_2$), molecular or ionic hydrogen, or hydrogen in an excited state. Preferably, the hydrogen is present as hydrogen gas and more preferably as a mixture with an inert gas, such as helium or nitrogen. When present in a mixture, the mixture usually contains about 5 to 95% by volume and preferably about 5 to about 15% by volume of hydrogen and, correspondingly about 95 to about 5% by volume and preferably about 95 to about 85% by volume of inert gas. Most preferably, the annealing gas is forming gas containing about 10% $H_2$ and about 90% $N_2$ by volume.

The annealing usually takes about 15 to about 30 minutes, typical example being about 20 minutes.

The following non-limiting example is presented to further illustrate the present invention.

EXAMPLE 1

Onto a dielectric substrate having aluminum lines patterned on an insulator is spun coated the flowable oxide ($FO_x15$). The oxide is flowed at a temperature of between 250° C. and 350° C. in nitrogen.

The gaps between the metal lines is filled conformally with the flowable oxide to the top of the lines. This structure is then cured in nitrogen at 400° C. for 1 to 2 hours followed by a 400° C. forming gas anneal for 20 minutes. The oxide layer had a dielectric constant of 2.9–3.

What is claimed is:

1. A process for covering an interconnection wiring level in a surface thereof on a semiconductor substrate which comprises:

coating said interconnection wiring level with a first flowable oxide layer;

curing said first flowable oxide layer; and annealing said flowable oxide wherein said annealing is carried out in the presence of hydrogen and aluminum to cause said hydrogen to diffuse into said first flowable oxide layer and chemically react with said flowable oxide reducing the dielectric constant of said first flowable oxide layer to a value below 3.2.

2. The process of claim 1 wherein the annealing is carried out at a temperature of about 350° C. to about 500° C.

3. The process of claim 2 wherein the annealing is carried out along with the curing.

4. The process of claim 2 wherein the annealing is carried out subsequent to the curing.

5. The process of claim 1 wherein said wiring level contains aluminum.

6. The process of claim 1 wherein the flowable oxide is flowed over said substrate by heating at about 250° C. to about 350° C.

7. The process of claim 1 wherein said flowable layer includes a hydrogen silsesquioxane.

8. The process of claim 7 wherein said hydrogen silsesquioxane is coated from a 1 to 20% solution.

9. The process of claim 1 wherein said annealing is carried out in the presence of forming gas.

10. The process of claim 1 wherein said curing is carried out in a nitrogen ambient at a temperature of about 360° C. to about 500° C.

11. The process of claim 7 wherein said annealing is carried out in the presence of forming gas.

12. The process of claim 1 wherein said flowable layer includes a carbon free silsesquioxane polymer.

13. The process of claim 1 wherein said flowable oxide layer has a thickness in the range from about 500 angstroms to above 1 micron.

14. The process of claim 1 wherein the dielectric constant of said oxide layer is 2.9–3.0.

15. The process of claim 1 wherein the curing and the annealing are carried out at temperatures of about 360° C. to about 440° C.

16. The process of claim 1 wherein the annealing is carried out for about 15 to about 30 minutes.

17. The process of claim 1 wherein the curing is carried out for about 1 to about 2 hours.

18. The process of claim 1 wherein said flowable layer includes a hydrogen silsesquioxane, said curing is carried out in a nitrogen atmosphere at a temperature of 360° C. to about 500° C., said annealing is carried out at a temperature of about 350° C. to about 500° C.; said flowable oxide is flowed over said substrate by heating at about 250° C. to about 350° C.

* * * * *

UNITED STATES PATENT AND TRADEMARK OFFICE
CERTIFICATE OF CORRECTION

PATENT NO. : 6,559,046 B1 Page 1 of 1
DATED : May 6, 2003
INVENTOR(S) : Stephan A. Cohen et al.

It is certified that error appears in the above-identified patent and that said Letters Patent is hereby corrected as shown below:

<u>Title page,</u>
Item [75], should read:

-- Inventors: Stephan Alan Cohen, Wappingers Falls, NY (US); Vincent James McGahay, Poughkeepsie, NY (US); Ronald Robert Uttecht, Essex Junction, VT (US); David S. Ballance, Cupertino, CA (US) --

Signed and Sealed this

Ninth Day of September, 2003

JAMES E. ROGAN
*Director of the United States Patent and Trademark Office*